US011735461B2

United States Patent
Lo et al.

(10) Patent No.: US 11,735,461 B2
(45) Date of Patent: Aug. 22, 2023

(54) ADHESIVE-LAYER STRUCTURE AND SEMICONDUCTOR STRUCTURE

(71) Applicant: PlayNitride Display Co., Ltd., MiaoLi County (TW)

(72) Inventors: Yu-Yun Lo, MiaoLi County (TW); Chih-Kai Huang, MiaoLi County (TW); Bo-Wei Wu, MiaoLi County (TW); Shiang-Ning Yang, MiaoLi County (TW)

(73) Assignee: PlayNitride Display Co., Ltd., MiaoLi County (TW)

( * ) Notice: Subject to any disclaimer, the term of this patent is extended or adjusted under 35 U.S.C. 154(b) by 0 days.

(21) Appl. No.: 17/485,489

(22) Filed: Sep. 26, 2021

(65) Prior Publication Data
US 2022/0375778 A1 Nov. 24, 2022

(30) Foreign Application Priority Data

May 21, 2021 (TW) .................................. 110118367

(51) Int. Cl.
*H01L 21/683* (2006.01)
*H01L 25/13* (2006.01)
*H01L 21/67* (2006.01)

(52) U.S. Cl.
CPC .... *H01L 21/6835* (2013.01); *H01L 21/67144* (2013.01); *H01L 25/13* (2013.01)

(58) Field of Classification Search
CPC ..................... H01L 21/6835; H01L 21/67144; H01L 25/13
(Continued)

(56) References Cited

U.S. PATENT DOCUMENTS 9,554,488 B2 * 1/2017 Kyhl ...................... H05K 3/321
9,627,363 B2 * 4/2017 Kim .................... H01L 25/0753
(Continued)

FOREIGN PATENT DOCUMENTS

| CN | 110491795 | 11/2019 |
| CN | 112216619 | 1/2021 |

(Continued)

OTHER PUBLICATIONS

Ge et al., "Study on Laser Repair of an Active Matrix Liquid Crystal Display", Chinese Journal of Lasers,vol. A26, No. 5, with English abstract, May 1999, pp. 1-4.
(Continued)

*Primary Examiner* — Vu A Vu
(74) *Attorney, Agent, or Firm* — JCIPRNET

(57) ABSTRACT

A semiconductor structure disposed on a temporary carrier board is provided. Multiple adhesive layers are disposed on the temporary carrier. The semiconductor structure includes an adhesive-layer structure and a micro light-emitting element. The adhesive-layer structure includes a mending adhesive layer and a buffer layer. The mending adhesive layer is disposed on the temporary carrier board. The micro light-emitting element is disposed on the mending adhesive layer. The buffer layer is disposed between the mending adhesive layer and the micro light-emitting element. A height of the mending adhesive layer is less than a height of each of the adhesive layers in a thickness direction of the temporary carrier board. A sum of the height of the mending adhesive layer and the height of the buffer layer is greater than or equal to a height of each of the adhesive layers.

17 Claims, 4 Drawing Sheets

(58) Field of Classification Search
USPC .......................................................... 257/88
See application file for complete search history.

(56) References Cited

U.S. PATENT DOCUMENTS

| | | | | |
|---|---|---|---|---|
| 9,721,922 | B2* | 8/2017 | Marimuthu | ......... H01L 23/5383 |
| 10,607,877 | B2* | 3/2020 | Lee | ................. H01L 21/67115 |
| 10,636,937 | B2* | 4/2020 | Liao | ................. H01L 33/0095 |
| 2008/0318027 | A1 | 12/2008 | Woychik et al. | |
| 2010/0186883 | A1* | 7/2010 | Tomoda | ............. H01L 25/0753 |
| | | | | 156/220 |
| 2017/0069796 | A1 | 3/2017 | Lin et al. | |
| 2018/0309019 | A1 | 10/2018 | Liao | |
| 2019/0067395 | A1 | 2/2019 | Kondo | |
| 2019/0189477 | A1* | 6/2019 | Chen | ................... H01L 21/6835 |
| 2020/0321391 | A1 | 10/2020 | Danesh et al. | |
| 2021/0005520 | A1 | 1/2021 | Ishio et al. | |
| 2021/0111148 | A1* | 4/2021 | Chen | ..................... H01L 24/81 |
| 2021/0376218 | A1* | 12/2021 | Todaka | ................ H10N 10/817 |
| 2021/0384051 | A1* | 12/2021 | Katz | .................. H01L 21/6833 |
| 2022/0181210 | A1* | 6/2022 | Kamikawa | .......... H01L 21/7806 |

FOREIGN PATENT DOCUMENTS

| | | |
|---|---|---|
| CN | 112331641 | 2/2021 |
| CN | 112786641 | 5/2021 |
| CN | 112864146 | 5/2021 |
| GB | 2596533 | 1/2022 |
| JP | H05218137 | 8/1993 |
| JP | H08213428 | 8/1996 |
| JP | 2001185582 | 7/2001 |
| JP | 2004179645 | 6/2004 |
| JP | 2006198572 | 8/2006 |
| JP | 2010114172 | 5/2010 |
| JP | 2020064118 | 4/2020 |
| JP | 2020064119 | 4/2020 |
| TW | I552385 | 10/2016 |
| TW | 201929191 | 7/2019 |
| TW | 202019599 | 6/2020 |
| WO | 03077618 | 11/2003 |
| WO | 2010059906 | 5/2010 |
| WO | 2015023540 | 2/2015 |

OTHER PUBLICATIONS

"Office Action of China Counterpart Application", dated Jun. 6, 2022, p. 1-p. 12.

"Office Action of Taiwan Counterpart Application", dated Aug. 15, 2022, p. 1-p. 6.

"Notice of allowance of China Counterpart Application", dated Oct. 24, 2022, p. 1-p. 5.

* cited by examiner

ADHESIVE-LAYER STRUCTURE AND SEMICONDUCTOR STRUCTURE

CROSS-REFERENCE TO RELATED APPLICATION

This application claims the priority benefit of Taiwan application serial no. 110118367, filed on May 21, 2021. The entirety of the above-mentioned patent application is hereby incorporated by reference herein and made a part of this specification.

BACKGROUND

Technical Field

This disclosure relates to an adhesive-layer structure and a semiconductor structure.

Description of Related Art

During the manufacturing process of a micro light-emitting element display panel, it is often necessary to transfer multiple micro light-emitting elements to a target substrate through a temporary carrier board, and to connect to other elements on the target substrate. The temporary carrier board also has functions such as transporting and storing the micro light-emitting elements.

However, the micro light-emitting elements may have defects during their production, resulting in one or more defective micro light-emitting elements. In order to improve production yield and reduce production costs, it is imperative that a method to replace the defective micro light-emitting elements is developed.

SUMMARY

This disclosure provides an adhesive-layer structure and a semiconductor structure. The adhesive-layer structure improves a replacement success rate of defective micro light-emitting elements, and the semiconductor structure has a high production yield.

According to an embodiment of the disclosure, a semiconductor structure, including a temporary carrier board, multiple adhesive layers, and multiple micro light-emitting elements, is provided. The multiple adhesive layers are disposed on the temporary carrier board. The multiple micro light-emitting elements are respectively disposed on the multiple adhesive layers. A height of a mending adhesive layer in the multiple adhesive layers is less than a height of the remaining adhesive layers in a thickness direction of the temporary carrier board.

According to another embodiment of the disclosure, a semiconductor structure is provided, which is disposed on a temporary carrier board, and multiple adhesive layers are disposed on the temporary carrier board. The semiconductor structure includes a micro light-emitting element and a buffer layer. The micro light-emitting element is disposed on one of the adhesive layers. The buffer layer is disposed between the adhesive layer and the micro light-emitting element, and a glass transition temperature of the buffer layer is lower than a glass transition temperature of the adhesive layer.

According to still another embodiment of the disclosure, an adhesive-layer structure is provided, which is disposed on a temporary carrier board, and the adhesive-layer structure includes a buffer layer and a mending adhesive layer. The buffer layer is disposed on the temporary carrier board, so as to correspondingly bond to a micro light-emitting element. The mending adhesive layer is disposed between the buffer layer and the temporary carrier board. A height of the buffer layer is greater than or equal to a height of the mending adhesive layer in a thickness direction of the temporary carrier board.

Based on the above, the adhesive-layer structure provided by the embodiment of the disclosure has the buffer layer and the mending adhesive layer, which improves the replacement success rate of the defective micro light-emitting elements. The semiconductor structure provided by the embodiment of the disclosure uses a buffer layer to bond to the mending adhesive layer and the micro light-emitting element, so that the semiconductor structure has a high production yield.

To make the above-mentioned features and advantages more comprehensible, several embodiments accompanied by drawings are described in detail as follows.

DESCRIPTION OF THE EMBODIMENTS

Reference is made to FIGS. 1A to 1D, which show a schematic flowchart of replacing defective micro light-emitting elements according to an embodiment of the disclosure.

Figure 1A:
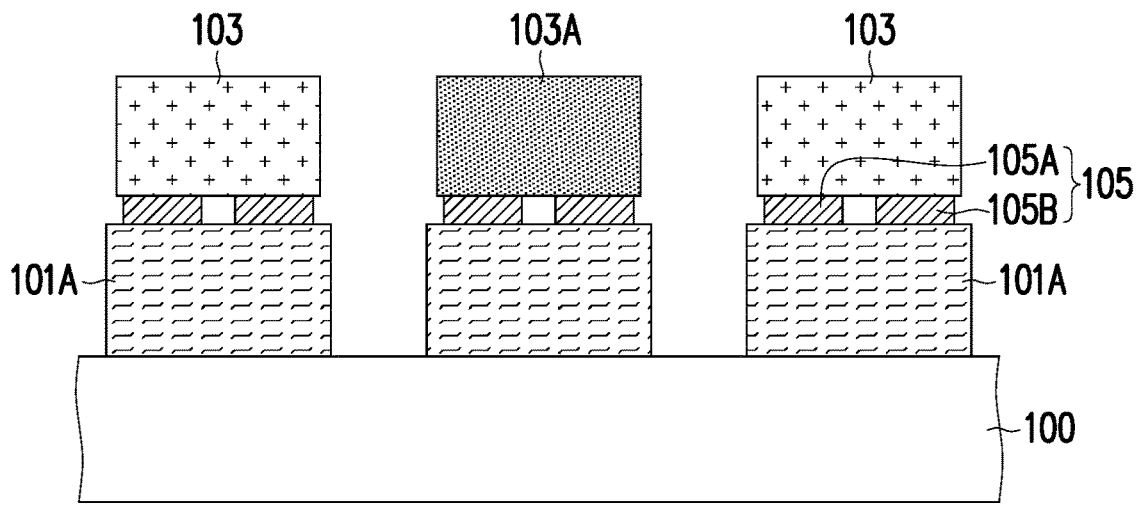
FIGS. 1A to 1D are a schematic flowchart of replacing defective micro light-emitting elements according to an embodiment of the disclosure.

With reference to FIG. 1A, it is shown that multiple adhesive layers 101A are disposed on a temporary carrier board 100. Micro light-emitting elements 103 are respectively disposed on the adhesive layers 101A, and a defective micro light-emitting element 103A is also disposed on the adhesive layer 101A. The number of the defective micro light-emitting element 103A is at least one.

Both the micro light-emitting element 103 and the defective micro light-emitting element 103A include an electrode group 105. The electrode group 105 includes a first electrode 105A and a second electrode 105B. The first electrode 105A and the second electrode 105B have different electrical polarities, and are disposed on the same side of the micro light-emitting element 103. In the embodiment, the temporary carrier board 100 is a non-circuit substrate.

Figure 1B:
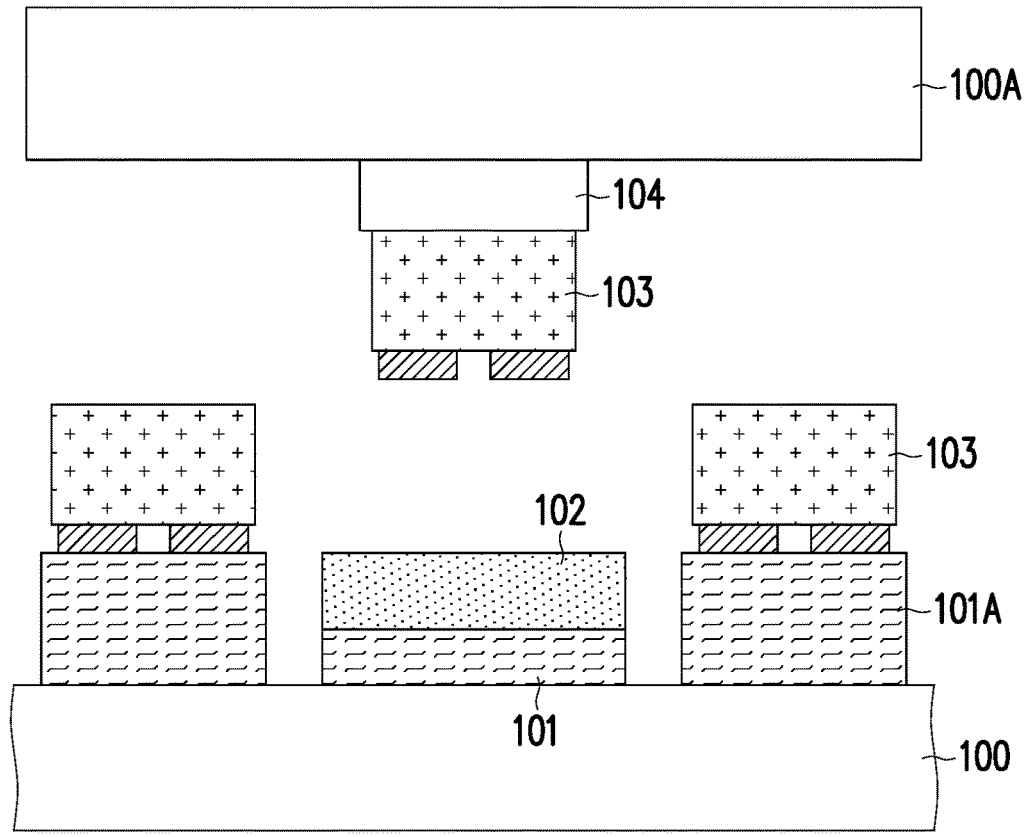

With reference to FIG. 1B, it is shown that the defective micro light-emitting element 103A and the adhesive layer 101A between the defective micro light-emitting element 103A and the temporary carrier board 100 in FIG. 1A are removed. A mending adhesive layer 101 and a buffer layer 102 are sequentially disposed on the temporary carrier board 100. The micro light-emitting element 103 disposed on a mending carrier board 100A is aligned with the buffer layer 102. The micro light-emitting element 103 is disposed on the mending carrier board 100A through a connection pad 104. In other embodiments of the disclosure (not shown), the micro light-emitting element 103 may be disposed on a mending work piece through the connection pad 104, and the micro light-emitting element 103 may be aligned with the buffer layer 102 by moving the mending work piece.

Figure 1C:
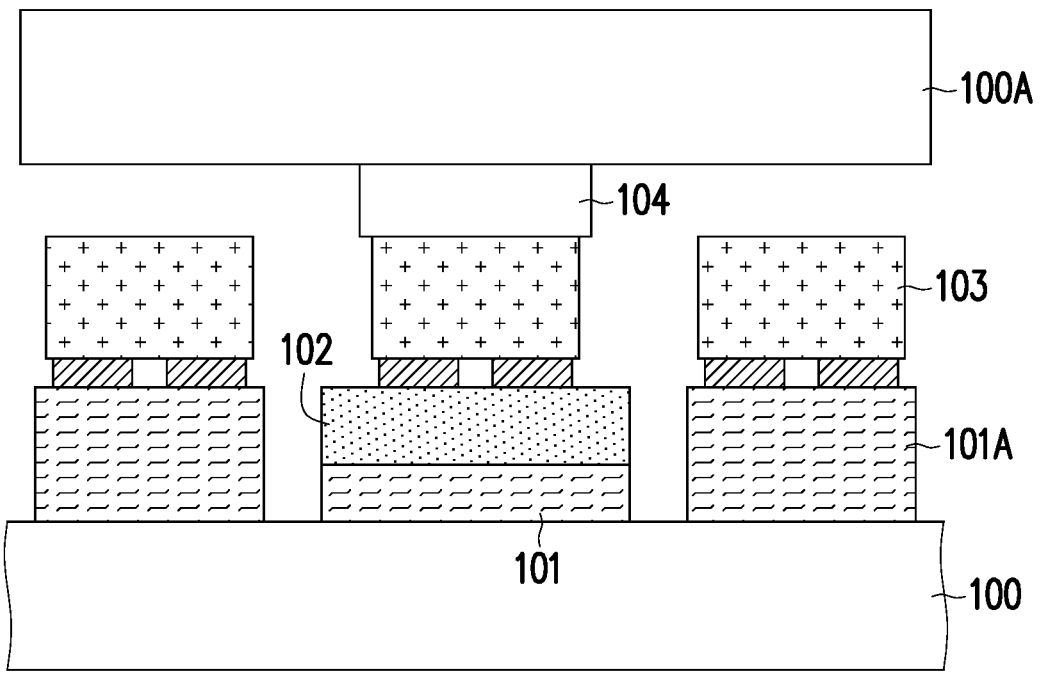

With reference to FIG. 1C, it is shown that by moving the mending carrier board 100A close to the temporary carrier board 100, the micro light-emitting element 103 and the connection pad 104 on the mending carrier board 100A may be bonded to the buffer layer 102 on the temporary carrier board 100.

Figure 1D:
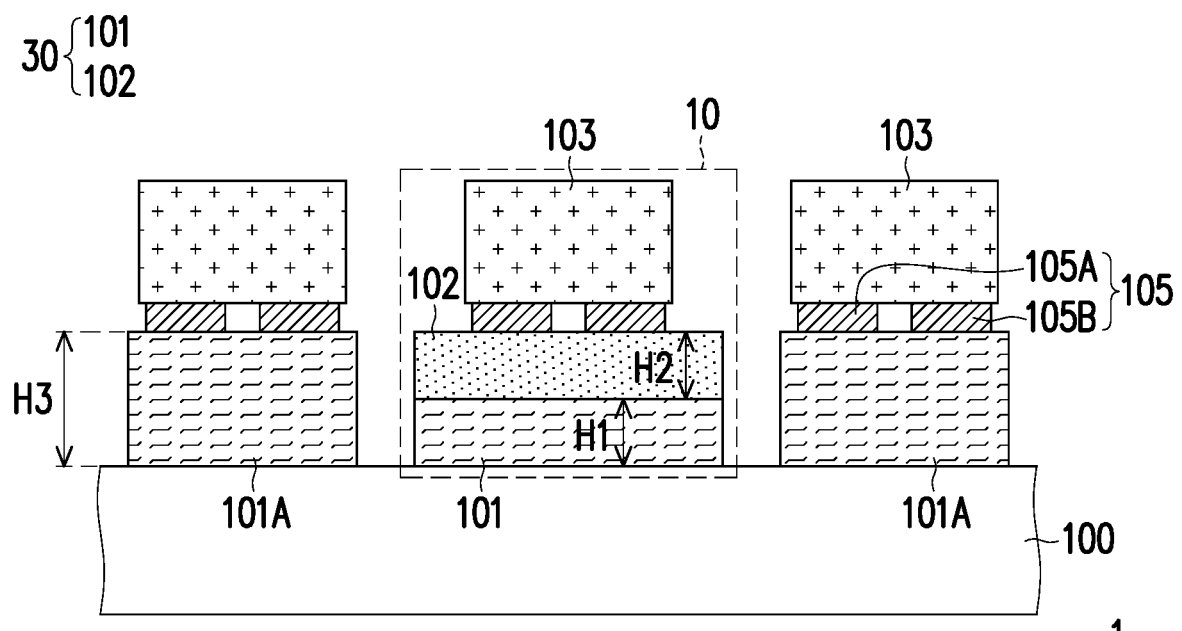

With reference to FIGS. 1C and FIG. 1D concurrently, it is shown in FIG. 1D that the micro light-emitting element 103 bonded to the buffer layer 102 is separated from the mending carrier board 100A and disposed on the temporary carrier board 100. According to an embodiment of the disclosure, a laser may be used to irradiate the connection pad 104 in FIG. 1C to soften the connection pad 104 so that the micro light-emitting element 103 may be separated from the mending carrier board 100A.

The embodiment illustrates how to manufacture a semiconductor structure 1 through the schematic flowchart shown in FIGS. 1A to 1D. The semiconductor structure 1 includes the temporary carrier board 100, the multiple adhesive layers 101A and 101, and the multiple micro light-emitting elements 103. The adhesive layers 101A and 101 are disposed on the temporary carrier board 100. The micro light-emitting elements 103 are respectively disposed on the adhesive layers 101A and 101. A height H1 of the mending adhesive layer 101 in the adhesive layers 101A and 101 is less than a height H3 of the adhesive layer 101A in a thickness direction of the temporary carrier board 100.

In FIG. 1D, the semiconductor structure 1 includes a semiconductor structure 10. The semiconductor structure 10 is disposed on the temporary carrier board 100, and the multiple adhesive layers 101A are disposed on the temporary carrier board 100. The semiconductor structure 10 includes an adhesive-layer structure 30 and the micro light-emitting element 103. The adhesive-layer structure 30 includes the mending adhesive layer 101 and the buffer layer 102. The mending adhesive layer 101 is disposed on the temporary carrier board 100. The micro light-emitting element 103 is disposed on the mending adhesive layer 101. The buffer layer 102 is disposed between the mending adhesive layer 101 and the micro light-emitting element 103. In the thickness direction of the temporary carrier board 100, the height H1 of the mending adhesive layer 101 is less than the height H3 of the adhesive layer 101A, the height H1 of the mending adhesive layer 101 is equal to a height H2 of the buffer layer 102, and a sum of the height H1 of the mending adhesive layer 101 and the height H2 of the buffer layer 102 is equal to the height H3 of the adhesive layer 101A.

In the embodiment, a material of the mending adhesive layer 101 and a material of the adhesive layer 101A are the same, but different from a material of the buffer layer 102, so that a manufacturing process environment has selectivity with regards to the two materials. For example, when an ambient temperature is between glass transition temperature of the material of the adhesive layers 101 and 101A and the material of the buffer layer 102, targeted mending may be facilitated. Specifically, when the ambient temperature is higher than the glass transition temperature of the buffer layer 102 and lower than the glass transition temperature of the adhesive layers 101 and 101A, a phase change occurs in the buffer layer 102 only, and the adhesive layers 101 and 101A do not have a phase change. Under such conditions, the micro light-emitting element 103 disposed on the buffer layer 102 may be mended under low stress without affecting the micro light-emitting element 103 disposed on the adhesive layer 101A. In contrast, in the related art, each of the micro light-emitting elements is disposed on the adhesive layer. Once a portion of the micro light-emitting elements 103 fail and have to be replaced, the ambient temperature has to be increased to the glass transition temperature of the adhesive layer 101 for bonding. In this configuration, not only are the adhesive layers 101A of the remaining normal micro light-emitting elements 103 affected, which results in a reduced yield, an effect on apportioning the bonding stress is also limited, which is not conducive for the above-mentioned targeted mending.

In other embodiments of the disclosure, the adhesive-layer structure 30 of the semiconductor structure 10 may only include the adhesive layer 101A and the mending adhesive layer 101, and not the buffer layer 102. The micro light-emitting element 103 is directly disposed on the mending adhesive layer 101, and the height H1 of the mending adhesive layer 101 is less than the height H3 of the adhesive layer 101A. Since the materials of the mending adhesive layer 101 and the adhesive layer 101A are the same, in the subsequent laser vaporization process, the micro light-emitting element 103 on the mending adhesive layer 101 and the micro light-emitting element 103 on the adhesive layer 101A may be debonded together from the mending adhesive layer 101 and the adhesive layer 101A, and reserve a space to allow more flexible options for the subsequent mending process, for example, fill in other bonding materials (such as the buffer layer 102) for mending the micro light-emitting element, as mentioned in FIGS. 1A to 1D.

In order to fully illustrate various implementation aspects of the disclosure, other embodiments of the disclosure are described as follows. It should be noted here that the following embodiments use the reference numerals and a part of the content of the foregoing embodiments, in which the same reference numerals are used to represent the same or similar elements, and description of the same technical content is omitted. Reference may be made to the foregoing embodiments for the description of the omitted part, which are not repeated in the following embodiments.

Figure 2A:
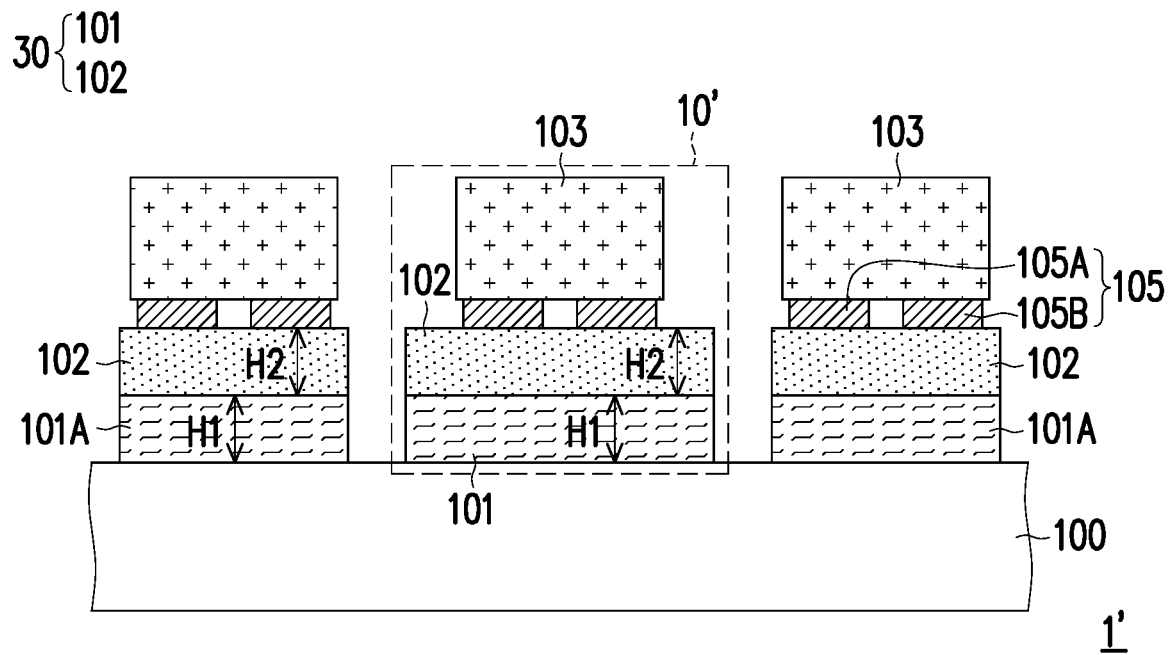
FIG. 2A is a schematic diagram of a semiconductor structure according to an embodiment of the disclosure.

With reference to FIG. 2A, FIG. 2A shows a schematic diagram of a semiconductor structure according to an embodiment of the disclosure. A semiconductor structure 1' includes a semiconductor structure 10'. The semiconductor structure 10' is disposed on the temporary carrier board 100, and the multiple adhesive layers 101A are disposed on the temporary carrier board 100. The semiconductor structure 10' includes the adhesive-layer structure 30 and the micro light-emitting element 103, and the adhesive-layer structure 30 includes the mending adhesive layer 101 and the buffer layer 102. The mending adhesive layer 101 is disposed on the temporary carrier board 100. The micro light-emitting element 103 is disposed on the mending adhesive layer 101. The buffer layer 102 is disposed between the mending adhesive layer 101 and the micro light-emitting element 103. The glass transition temperature of the buffer layer 102 is lower than the glass transition temperature of the mending adhesive layer 101.

A difference between the embodiment shown in FIG. 2A and the embodiment shown in FIG. 1D is that in the thickness direction of the temporary carrier board 100, the height H1 of the mending adhesive layer 101 is equal to a height H1 of the adhesive layer 101A, and the buffer layer 102 is also disposed on the adhesive layer 101A. In other words, the embodiment shown in FIG. 2A may be regarded as an extended application of the embodiment shown in FIG. 1D, in which the buffer layers 102 are disposed on both the mending adhesive layer 101 and the adhesive layer 101A.

In the embodiment, the height of the buffer layer 102 on the mending adhesive layer 101 is H2, and the height of the buffer layer 102 on the adhesive layer 101A is also H2, but the disclosure is not limited thereto. In other embodiments of the disclosure, the height of the buffer layer 102 on the adhesive layer 101A is different from the height of the buffer layer 102 on the mending adhesive layer 101.

Figure 2B:
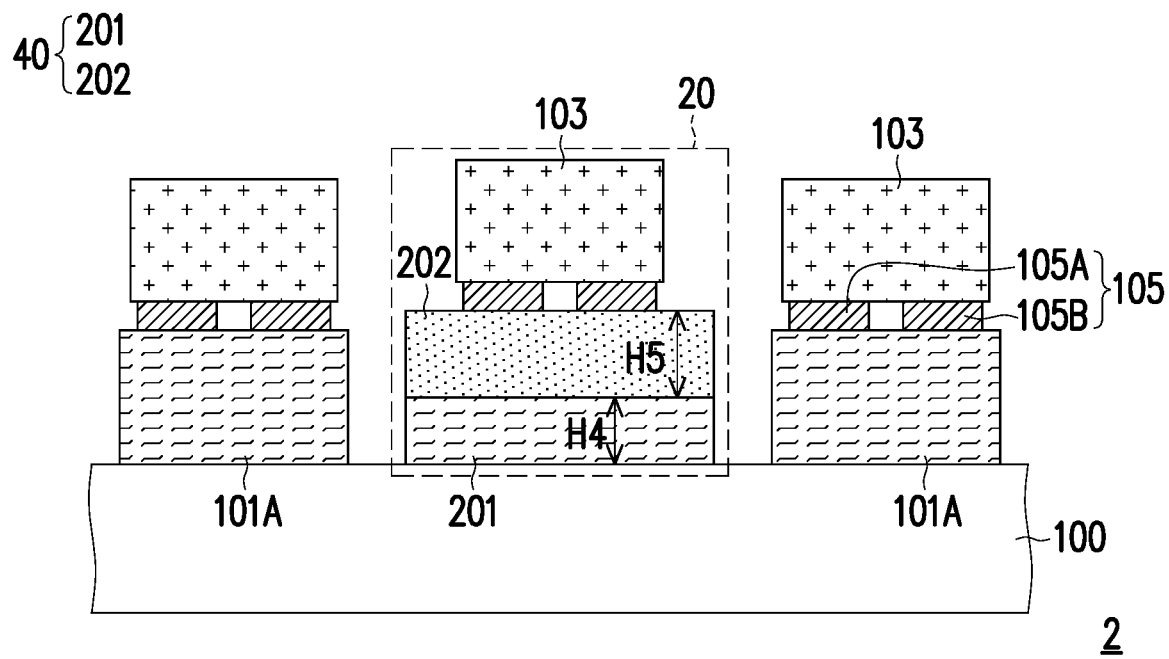
FIG. 2B is a schematic diagram of a semiconductor structure according to an embodiment of the disclosure.

With reference to FIG. 2B, FIG. 2B shows a schematic diagram of a semiconductor structure 2 according to an embodiment of the disclosure. The semiconductor structure 2 includes a semiconductor structure 20. The semiconductor structure 20 is disposed on the temporary carrier board 100, and the multiple adhesive layers 101A are disposed on the temporary carrier board 100. The semiconductor structure 20 includes an adhesive-layer structure 40 and the micro light-emitting element 103. The adhesive-layer structure 40 includes a mending adhesive layer 201 and a buffer layer 202. A difference between the semiconductor structure 2 and the semiconductor structure 1 is that in the thickness direction of the temporary carrier board 100, a height H5 of the buffer layer 202 is greater than a height H4 of the mending adhesive layer 201, and a sum of the height H4 of the mending adhesive layer 201 and the height H5 of the buffer layer 202 is greater than the height H3 of the adhesive layer 101A.

As mentioned above, since a function of the mending adhesive layer 101 is to separate the micro light-emitting element 103 from the temporary carrier board 100 in the subsequent manufacturing process, its thickness may be disposed to be relatively thin, while a thicker buffer layer 202 not only may provide a good cushioning effect, because the sum of the heights H4 and H5 is greater than the height H3, it may ensure that the micro light-emitting element 103 to be repaired is bonded to the buffer layer 202, and concurrently reduces influence on the other micro light-emitting elements 103 that are already normally bonded during the bonding process.

Figure 3:
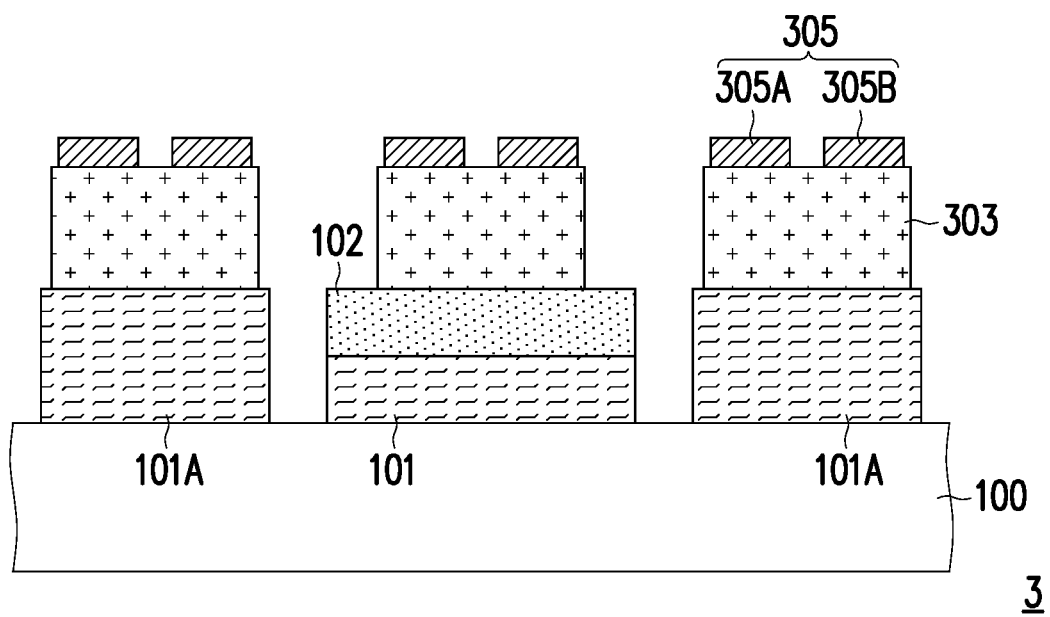
FIG. 3 is a schematic diagram of a semiconductor structure according to an embodiment of the disclosure.

With reference to FIG. 3, FIG. 3 shows a schematic diagram of a semiconductor structure 3 according to an embodiment of the disclosure. The semiconductor structure 3 includes the temporary carrier board 100, the multiple adhesive layers 101A and 101, the buffer layer 102, and multiple micro light-emitting elements 303. The micro light-emitting element 303 includes an electrode group 305, and the electrode group 305 includes a first electrode 305A and a second electrode 305B. A difference between the semiconductor structure 3 and the semiconductor structure 1 is that in semiconductor structure 1, the first electrode 105A and the second electrode 105B of the micro light-emitting element 103 corresponding to the adhesive layer 101A and the mending adhesive layer 101 are bonded to the adhesive layer 101A or the buffer layer 102, while in the semiconductor structure 3, the first electrode 305A and the second electrode 305B of the micro light-emitting element 303 corresponding to the adhesive layer 101A and the mending adhesive layer 101 do not bond to the adhesive layer 101A and the buffer layer 102.

In an embodiment of the disclosure, the buffer layer 102 may not absorb a laser light used to separate the micro light-emitting element 303 and the mending adhesive layer 101, and the buffer layer 102 is transparent. Therefore, during the manufacturing process of separating the micro light-emitting element 303 and the mending adhesive layer 101 by laser, the buffer layer 102 may remain on the micro light-emitting element 303, and a probability of light being emitted from a light-emitting surface may be increased by a surface structure of the buffer layer 102, thereby improving luminous efficiency.

In an embodiment of the disclosure, the first electrode and the second electrode of the micro light-emitting element corresponding to the mending adhesive layer 101 in the semiconductor structure 1 are disposed on two opposite sides of the micro light-emitting element. In an embodiment of the disclosure, the first electrode and the second electrode of the micro light-emitting element corresponding to the mending adhesive layer 101 in the semiconductor structure 3 are disposed on two opposite sides of the micro light-emitting element.

In the above embodiments, the glass transition temperatures of the buffer layers 102 and 202 are lower than the glass transition temperatures of the adhesive layers 101A, 101 and 201. In other words, during the manufacturing process, ductility of the buffer layers 102 and 202 is higher than ductility of the adhesive layers 101A, 101 and 201, so that in the process of bonding the micro light-emitting elements 103 and 303 by the buffer layers 102 and 202, the adhesive layers 101A, 101, and 201 do not overflow.

In the above embodiments, materials of the buffer layers 102 and 202 may include high-molecular polymer. The high-molecular polymer is composed of repeating units of the same molecular structure or multiple molecular structures, and is polymer with a molecular weight of more than 10,000 and composed of repeating units. Different glass transition temperatures may be obtained when a type of the molecular structure is adjusted, which have individual unique viscoelastic behaviors within a specific temperature range, and follow the time-temperature superposition principle. That is, under a fixed stress, a viscoelasticity decreases with an increase in application time, decreases with an increase in temperature, or increases with a decrease in temperature. The increase in the time or the increase in the temperature shows a same effect on the viscoelastic behavior. Therefore, different types of high molecular polymers may be used at different bonding processing temperatures, so as to provide the most effective absorption and dispersion of stress, to prevent rupturing of a chip due to concentration of forces. Specifically, the materials of the buffer layers 102 and 202 may include polyethylene, polypropylene, polyesters, polyurethanes, acrylate polymers, polydimethylsiloxane (PDMS), or a combination thereof, or a related copolymer thereof, or such as high molecular polymer with a molecular chain containing a methyl group (—$CH_3$), a methylene bridge (—$CH_2$—), a benzene ring, an ether linkage (—O—), a ester linkage (—COO—), a urethane linkage (—NH—COO—), a urea linkage (—NH—CO—NH—), a peptide linkage (—NH—CO—), a silyl linkage (—Si—), or an imide linkage (—CO—N—CO—).

In the above-mentioned embodiments, materials of the mending adhesive layers 101 and 201 may include high molecular polymer. The high-molecular polymer is composed of repeating units of the same molecular structure or multiple molecular structures. Different thermal cracking temperatures may be obtained when a type of the molecular structure of the repeating unit is adjusted and different thermal cracking temperatures may also be obtained when a molecular weight of the polymer is adjusted. With a set temperature (below 300 degrees), the high molecular polymer may be pyrolyzed into small molecular fragments and release the adhered elements. In other words, the mending adhesive layers 101 and 201 may include a thermolysis material. Specifically, the material of the mending adhesive layers 101 and 201 may include polyethylene, polypropylene, polyesters, polyurethanes, acrylate polymers, polyvinyl alcohol, polyvinyl acetate, polydimethylsiloxane (PDMS), or a combination thereof, or a related copolymer thereof, or such as high molecular polymers with a molecular chain containing a methyl group (—$CH_3$), a methylene bridge (—$CH_2$—), a benzene ring, an ether linkage (—O—), a ester linkage (—COO—), a urethane linkage (—NH—COO—), a urea linkage (—NH—CO—NH—), a peptide linkage (—NH—CO—), a silyl linkage (—Si—), or an imide linkage (—CO—N—CO—).

The mending adhesive layers 101 and 201 may also include a photolysis material. Different light wavelengths may be targeted to perform absorption when a type of molecular bonding of the repeating unit is adjusted. With a corresponding wavelength (100 nm to 400 nm) and energy, a light-absorbing group segment in the polymer may be photodegraded into small molecular fragments to release the attached elements. A molecular chain of this type of light-absorbing group may contain, such as a vinyl bond (C═C bond), a hydrogen-oxygen bond (O—H bond, hydroxyl group), a carbon-fluorine bond (C—F bond), a carbon-hydrogen bond (C—H bond), a nitrogen-hydrogen bond (N—H bond), a nitrogen-nitrogen bond (N—N bond), an azo bond (N═N bond), an oxygen-oxygen bond (O—O bond), a peroxy bond (O═O bond), a carbon-oxygen bond (C—O bond), a carbon-carbon bond (C—C bond), a carbon-chlorine bond (C—Cl bond), or a carbon-nitrogen bond (C—N bond).

In summary, the adhesive-layer structure provided by the embodiments of the disclosure has the buffer layer and the mending adhesive layer, which improves the replacement success rate of the defective micro light-emitting elements. The semiconductor structure provided by the embodiments of the disclosure uses the buffer layer to bond the mending adhesive layer and the micro light-emitting element, so that the semiconductor structure has a high production yield.

Although the disclosure has been disclosed with the foregoing exemplary embodiments, it is not intended to limit the disclosure. Any person skilled in the art can make various changes and modifications within the spirit and scope of the disclosure. Accordingly, the scope of the disclosure is defined by the claims appended hereto and their equivalents.

What is claimed is:

1. A semiconductor structure, comprising:
   a temporary carrier board;
   a plurality of adhesive layers, disposed on the temporary carrier board;
   a plurality of micro light-emitting elements, respectively disposed on the adhesive layers, wherein a height of a mending adhesive layer in the plurality of adhesive layers is less than a height of the remaining plurality of adhesive layers in a thickness direction of the temporary carrier board; and
   a buffer layer, disposed between the mending adhesive layer and a corresponding micro light-emitting element, wherein a sum of a height of the buffer layer and the height of the mending adhesive layer is greater than or equal to the height of the remaining plurality of adhesive layers in a thickness direction of the temporary carrier board, each of the remaining plurality of adhesive layers directly contacts one of the micro light-emitting elements, and the buffer layer directly contacts the corresponding micro light-emitting element.

2. The semiconductor structure according to claim 1, wherein a glass transition temperature of the buffer layer is lower than a glass transition temperature of the plurality of adhesive layers.

3. The semiconductor structure according to claim 1, wherein the micro light-emitting element has two electrodes with different electrical polarities, and the two electrodes are disposed on a same side or two opposite sides of the micro light-emitting element.

4. The semiconductor structure according to claim 1, wherein the micro light-emitting element has two electrodes with different electrical polarities, and the buffer layer is bonded to at least one of the two electrodes.

5. The semiconductor structure according to claim 1, wherein a material of the buffer layer comprises polyethylene, polypropylene, polyester, polyurethane, acrylate polymer, polydimethylsiloxane, or a combination thereof.

6. The semiconductor structure according to claim 1, wherein the mending adhesive layer comprises a thermolysis material or a photolysis material.

7. The semiconductor structure according to claim 1, wherein a material of the mending adhesive layer comprises polyethylene, polypropylene, polyester, polyurethane, acrylate polymer, polyvinyl alcohol, polyvinyl acetate, polydimethylsiloxane, or a combination thereof.

8. The semiconductor structure according to claim 1, wherein the temporary carrier board is a non-circuit substrate.

9. A semiconductor structure, disposed on a temporary carrier board, and a plurality of adhesive layers are disposed on the temporary carrier board, the semiconductor structure comprising:
   a micro light-emitting element, bonded to the temporary carrier board and disposed on one of the plurality of adhesive layers; and
   a buffer layer, disposed between the adhesive layer and the micro light-emitting element and adapted to buffer pressure from the micro light-emitting element while the micro light-emitting element is bonded to the temporary carrier board, and a glass transition temperature of the buffer layer is lower than a glass transition temperature of the adhesive layer with the micro light-emitting element.

10. The semiconductor structure according to claim 9, wherein the adhesive layer which the micro light-emitting element is correspondingly disposed on is a mending adhesive layer, and a height of the mending adhesive layer is less than or equal to a height of the remaining plurality of adhesive layers in a thickness direction of the temporary carrier board, or a sum of the height of the mending adhesive layer and a height of the buffer layer is greater than or equal to the height of the remaining plurality of adhesive layers in the thickness direction of the temporary carrier board.

11. An adhesive-layer structure, disposed on a temporary carrier board, the adhesive-layer structure comprising:
   a buffer layer, disposed on the temporary carrier board, so as to correspondingly bond to a first micro light-emitting element;
   a mending adhesive layer, distinct from the buffer layer and disposed between the buffer layer and the temporary carrier board, wherein a height of the buffer layer is greater than or equal to a height of the mending adhesive layer in a thickness direction of the temporary carrier board; and
   a plurality of adhesive layers disposed on the temporary carrier board, wherein each of the plurality of adhesive layers is disposed to correspondingly bond to a second micro light-emitting element, a sum of the heights of the mending adhesive layer and the buffer layer is greater than or equal to a height of the each of the plurality of adhesive layers in the thickness direction of the temporary carrier board, the buffer layer directly contacts the first micro light-emitting element, and the plurality of adhesive layer respectively and directly contact the second micro light-emitting element.

12. The adhesive-layer structure according to claim 11, wherein a glass transition temperature of the buffer layer is lower than a glass transition temperature of the mending adhesive layer.

13. The adhesive-layer structure according to claim 11, wherein the height of the mending adhesive layer is less than a height of the each of the plurality of adhesive layers in the thickness direction of the temporary carrier board.

14. The adhesive-layer structure according to claim 11, wherein a material of the buffer layer comprises polyethylene, polypropylene, polyester, polyurethane, acrylate polymer, polydimethylsiloxane, or a combination thereof.

15. The adhesive-layer structure according to claim 11, wherein the mending adhesive layer comprises a thermolysis material or a photolysis material.

16. The adhesive-layer structure according to claim 11, wherein a material of the mending adhesive layer comprises polyethylene, polypropylene, polyester, polyurethane, acrylate polymer, polyvinyl alcohol, polyvinyl acetate, polydimethylsiloxane, or a combination thereof.

17. The adhesive-layer structure according to claim 11, wherein the temporary carrier board is a non-circuit substrate.

* * * * *